(12) United States Patent
Fadeyev et al.

(10) Patent No.: US 8,841,170 B2
(45) Date of Patent: Sep. 23, 2014

(54) METHODS FOR SCRIBING OF SEMICONDUCTOR DEVICES WITH IMPROVED SIDEWALL PASSIVATION

(75) Inventors: Vitaliy Fadeyev, Santa Cruz, CA (US); Hartmut F. W. Sadrozinski, Palo Alto, CA (US); Marc Christophersen, Berwyn Heights, MD (US); Bernard F. Phlips, Great Falls, VA (US)

(73) Assignees: The Regents of the University of California, Oakland, CA (US); Naval Research Laboratory, Washington, DC (US)

( * ) Notice: Subject to any disclaimer, the term of this patent is extended or adjusted under 35 U.S.C. 154(b) by 0 days.

(21) Appl. No.: 13/879,971

(22) PCT Filed: Oct. 21, 2011

(86) PCT No.: PCT/US2011/001794
§ 371 (c)(1),
(2), (4) Date: Apr. 17, 2013

(87) PCT Pub. No.: WO2012/057823
PCT Pub. Date: May 3, 2012

(65) Prior Publication Data
US 2013/0203239 A1    Aug. 8, 2013

Related U.S. Application Data

(60) Provisional application No. 61/455,823, filed on Oct. 27, 2010, provisional application No. 61/464,208, filed on Mar. 1, 2011.

(51) Int. Cl.
| | | |
|---|---|---|
| H01L 21/44 | (2006.01) | |
| H01L 21/48 | (2006.01) | |
| H01L 21/50 | (2006.01) | |
| B23K 26/00 | (2014.01) | |
| H01L 21/78 | (2006.01) | |
| H01L 31/18 | (2006.01) | |
| B23K 26/40 | (2014.01) | |
| B23K 26/36 | (2014.01) | |

(52) U.S. Cl.
CPC ............ *H01L 21/78* (2013.01); *B23K 26/0042* (2013.01); *B23K 26/0057* (2013.01); *B23K 26/0081* (2013.01); *H01L 31/1804* (2013.01); *B23K 26/4075* (2013.01); *B23K 26/367* (2013.01); *B23K 26/0087* (2013.01); *Y02E 10/547* (2013.01)
USPC ............ 438/114; 257/E21.237; 257/E21.596; 257/E21.599; 438/33; 438/460; 438/462; 438/463; 438/464

(58) Field of Classification Search
USPC .................. 257/E21.237, E21.596, E21.599; 438/33, 114, 460, 462, 463, 464
See application file for complete search history.

(56) References Cited

U.S. PATENT DOCUMENTS

| | | | |
|---|---|---|---|
| 2003/0034536 A1* | 2/2003 | Scheeper et al. | 257/419 |
| 2003/0077878 A1* | 4/2003 | Kumar et al. | 438/460 |
| 2006/0180834 A1* | 8/2006 | Holland | 257/215 |
| 2008/0242000 A1 | 10/2008 | Kwon et al. | |
| 2008/0251891 A1 | 10/2008 | Chou et al. | |
| 2008/0315376 A1* | 12/2008 | Tang et al. | 257/660 |
| 2010/0072635 A1 | 3/2010 | Chen et al. | |
| 2011/0171777 A1* | 7/2011 | Muto | 438/107 |

OTHER PUBLICATIONS

Abreu et al. Electrical and Transient Current Characterization of Edgeless Si Detectors Diced With Different Methods, IEEE Transactions on Nuclear Science, vol. 49, No. 3, Jun. 2002.
Harkonen et al. Magnetic Czochralski silicon as detector material, Nuclear Instruments and Methods in Physics Research A 579 (2007) 648-652.

* cited by examiner

*Primary Examiner* — Asok K Sarkar
(74) *Attorney, Agent, or Firm* — Lumen Patent Firm

(57) ABSTRACT

A method of singulating semiconductor devices in the close proximity to active structures by controlling interface charge of semiconductor device sidewalls is provided that includes forming a scribe on a surface of a semiconductor devices, where the scribe is within 5 degrees of a crystal lattice direction of the semiconductor device, cleaving the semiconductor device along the scribe, where the devices are separated, using a coating process to coat the sidewalls of the cleaved semiconductor device with a passivation material, where the passivation material is disposed to provide a fixed charge density at a semiconductor interface of the sidewalls, and where the fixed charge density interacts with charge carriers in the bulk of the material.

19 Claims, 12 Drawing Sheets

Al₂O₃ deposition on back side of p-type sensor
(no back side protection needed)

Al₂O₃ RIE etching or ion milling on back side
(need to stop on the back side Al layer)

METHODS FOR SCRIBING OF SEMICONDUCTOR DEVICES WITH IMPROVED SIDEWALL PASSIVATION

STATEMENT OF GOVERNMENT SPONSORED SUPPORT

This invention was made with Government support under contract PHY-0612811 awarded by NATIONAL SCIENCE FOUNDATION. The Government has certain rights in this invention.

FIELD OF THE INVENTION

The present invention relates generally to radiation detectors. More particularly, the invention relates to radiation detectors having reduced non-active areas in the border regions of active areas.

BACKGROUND OF THE INVENTION

The simplest type of semiconductor radiation detector involves observing the change in conductivity in a semiconductor due to the creation of additional charge carriers by an incident electromagnetic field or ionization created by a charged particle. These devices are commonly known as photoconductors. Semiconductor junction photodiodes can exhibit dramatically improved performance over simple photoconductor detectors. The most common form of photodiode used is the silicon PIN diode in which a thick layer of an intrinsic semiconductor is grown between the n and p layers of the junction. The same structure can be made in germanium or any compound semiconductor. PIN diodes are normally fabricated using n-type silicon substrates with a bulk resistivity >1,000 Ohm-cm.

These PIN diodes normally work under full depletion. The depletion region is devoid of free thermal carriers. Hence, it is necessary to ensure the operation of PIN sensors at high voltages, where the PIN sensors are limited by the breakdown phenomena. Breakdown of these sensors is generally caused by the electric field enhancement at the edges and corners. Since these sensors are made on silicon wafers, individual devices need to be separated. This process is called dicing. Dicing is normally done by using a diamond blade, which generates mechanical damage on the cut surface. This damage leads to a damaged silicon region that shows electrical conductivity and promotes electric breakdowns.

Modern radiation detectors are based on high-voltage semiconductor devices. They are often segmented for position sensitive detection. The semiconductor substrates are commonly silicon, germanium, III-VI, or II-VI compound semiconductor. The basic operation is similar to a solar cell. The radiation hits the detector and generates charge carriers, which are then collected on either top or bottom surface of the device. In order to achieve good charge collection from the full depth of the detector, voltages up to several thousands volts are applied. Charge collection only happens in the active area of the devices; the border regions are non-active. A guard ring or multiple guard rings separate the active from the border regions. Furthermore, the guard ring protects to active region of the device from the damage from the dicing. Since the size of a single device is limited (max. by the wafer size), larger detector arrays are formed using tiled semiconductor devices. Sensor tiling or other techniques lead to detectors systems with large instrumented surfaces. Since border regions of each individual device are still inactive, one wants to minimize these dead regions. Outside of the guard rings there is often an implant region, which, through the conductive edge of the cut, brings the backside potential to the top periphery of the detector. This limits the current which otherwise might flow through the cut edge containing large defect density.

In some cases, the area in the immediate vicinity to the edge on either top or bottom surface has an additional implant to keep the field gradient away from the conductive edge. Neither the guard ring structure nor the implant area contributes to collection of electrical charge.

The standard approach to form an active edge is to microfabricate a trench around the device. The trench micro-fabrication is done by silicon reactive ion etching (RIE). RIE has become more and more common for the fabrication of high-aspect ratio structures in silicon. RIE etching is sometime called dry silicon etching in comparison to wet chemical or electrochemical etching. RIE is done in plasma, ions are accelerated towards the material to be etched, and the etching reaction is enhanced in the direction of the ion. RIE etching is a single wafer process; making this process very time-consuming and costly. The etching of high-aspect ratio structures in silicon is done by using high density, inductively coupled plasma (ICP) and fluorine-ion based chemistry. ICP-plasmas give very high plasma and radical densities and low substrate bias, which allow the formation of high-aspect ratio structures with no crystal damage. This technique is called DRIE (deep reactive ion etching). After the trench micro-fabrication the trench is oxidized or an active junction is formed. An active junction is based on a p-n junction within the silicon.

What is needed is a method for reducing the inactive area, minimizing the number of needed guard rings or removing them and eliminating the need of using an implant to detectors.

SUMMARY OF THE INVENTION

To address the needs in the art, a method of singulating semiconductor devices in the close proximity to active structures by controlling interface charge of semiconductor device sidewalls is provided that includes forming a scribe on a surface of a semiconductor devices, where the scribe is within 5 degrees of a crystal lattice direction of the semiconductor device, cleaving the semiconductor device along the scribe, where the devices are separated, using a coating process to coat the sidewalls of the cleaved semiconductor device with a passivation material, where the passivation material is disposed to provide a fixed charge density at a semiconductor interface of the sidewalls, and where the fixed charge density interacts with charge carriers in the bulk of the material.

According to one aspect, the invention further includes coating the passivation material with a second coating, where the second coating is electrically conductive, and the second coating is connected to an external voltage source. The applied voltage generates an electric filed within the semiconductor, analogous to the fixed charge.

In another aspect of the invention, the scribe is formed by a process that can include etching, laser-machining, deposition of light energy within a semiconductor device volume, or applying a mechanical force using a mechanical scribing apparatus. Here, the etching can be done with $XeF_2$ (xenon difluoride). Further, the laser can have a specific wavelength in a spectral region that includes ultraviolet, deep ultraviolet, visible light, infrared, or far infra-red.

According to another aspect of the invention, the scribe includes photo masking the semiconductor device to define a scribe line, and etching a top surface of the semiconductor device using a reactive ion etching process.

In another aspect of the invention, the cleaving is formed by a process that can include bending the semiconductor device, applying a force across the scribe, where the scribe is disposed between a pair of fulcrums, an automatic roll breaker, a tap expender, or a wafer singulation system.

In yet another aspect of the invention, sidewalls of the cleaved semiconductor device can be coated by using atomic layer deposition, chemical vapor deposition, plasma-enhanced chemical vapor deposition, vapor deposition, corona discharge, or flame-based aerosol coating.

In a further aspect of the invention, the semiconductor device is made from silicon having a substrate resistivity over 1,000 Ohm-cm. In one aspect the semiconductor device is an n-type silicon radiation detector comprising a positive fixed charge density on the sidewall. Here, the passivation material on the sidewalls can be $SiO_2$ or $Si_3N_4$.

In another aspect of the invention, the semiconductor device is a p-type radiation detector having a negative fixed charge density on the sidewall. Here, the passivation material on the sidewalls can be $Al_2O_3$.

According to one aspect of the invention, the coating is can include $Al_2O_3$, $SiO_2$, $Si_3N_4$, (a-$Si_xN_y$:H), amorphous silicon, CdTe, and $TiO_2$.

In a further aspect of the invention, a depth of the scribe can be up to 50 micrometer.

In yet another aspect of the invention, fabricating a minimal peripheral structure for the semiconductor device includes disposing the scribe proximal to a guard ring of the device or to an active area of the device without a guard ring.

In a further aspect of the invention, the semiconductor device can include a solar cell, an imaging device, or a high voltage integrated circuit device.

According to a further aspect of the invention, the scribing is done in a gas atmosphere, where the gas in the atmosphere reacts with the semiconductor during the scribing, where the reaction forms a fixed charge density.

DETAILED DESCRIPTION

An edge of a detector is defined by the process by which devices are singulated from a semiconductor wafer following the processing of the wafer. The invention includes a method of singulating semiconductor devices in close proximity to the active structures by controlling the interface charge of the semiconductor device sidewalls. According to one embodiment, a scribe is formed on the surface of a semiconductor devices, for example the scribe is within 5 degrees of a crystal lattice direction of the semiconductor device, and then cleaving the semiconductor device along the scribe, where the devices are separated. After separation, a coating process is used to coat the sidewalls of the cleaved semiconductor device with a passivation material, where the passivation material is disposed to provide a fixed charge density at a semiconductor interface of the sidewalls, and the fixed charge density interacts with charge carriers in the bulk of the material.

In a further aspect of the invention, the semiconductor device is made from silicon having a substrate resistivity over 1,000 Ohm-cm. In one aspect the semiconductor device is an n-type silicon radiation detector comprising a positive fixed charge density on the sidewall. Here, the passivation material on the sidewalls can be $SiO_2$ or $Si_3N_4$. Further, the coating is can include $Al_2O_3$, $SiO_2$, $Si_3N_4$, (a-$Si_xN_y$:H), amorphous silicon, CdTe, and $TiO_2$.

The current invention enables singulating the semiconductor wafer closer to the active area than what is known in the art. In one embodiment, the singulation is done by scribing the surface of the individual devices, for example with a laser beam or etching, followed by cleaving of the rest of the volume results in a sidewall after scribing with improved passivating properties for better electrical device performance. High resistivity of the edge allows one to avoid the implant region and to minimize the number of guard rings, thereby dramatically reducing the area occupied by inactive periphery. For high voltage devices, the high voltage potential from the backplane is not present on the top surface, which can be beneficial for packaging a detector with readout electronics in some applications. Tiled radiation detector arrays find a wide range of uses in Military, Home-Land-Security, and civilian applications. Examples for civil applications are medical imaging and trackers in high-energy physics experiments. The current invention includes use for solar cell fabrication or densely packed high voltage electronics. According to the invention, the etching can be done with $XeF_2$ (xenon difluoride). Further, the laser can have a specific wavelength in a spectral region that includes ultraviolet, deep ultraviolet, visible light, infrared, or far infra-red.

Figure 1:
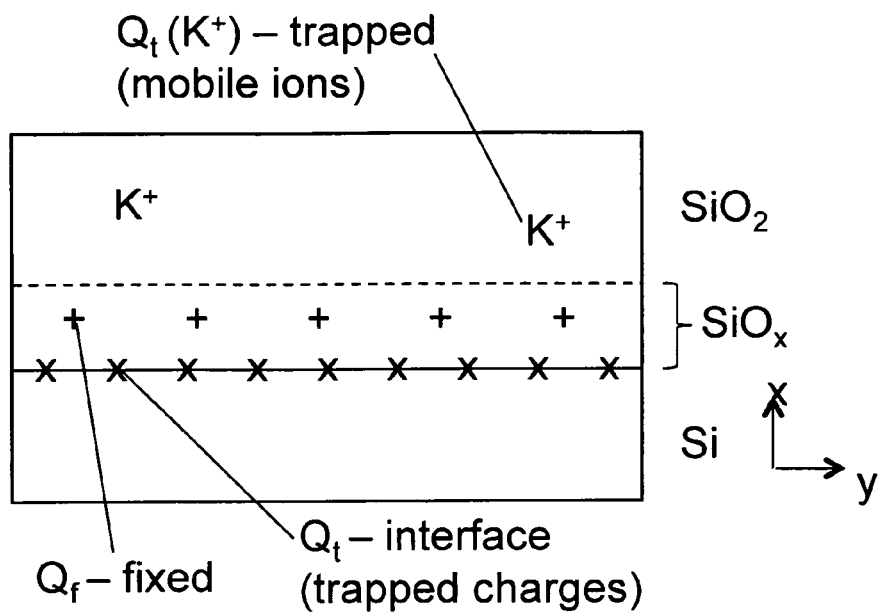
FIG. 1 shows a schematic drawing of the charges at the silicon/silicon oxide interface, according to one embodiment of the invention.

FIG. 1 shows a schematic drawing of a silicon/silicon oxide interface, where shown is a non-stoichiometric $SiO_2$ layer, which has a positive charge (label $Q_f$), trapped interface charge $Q_t$, and trapped mobile ions $Q_t(K^+)$. This positive charge attracts electrons. Thermally grown oxides typically have from $\sim 10^{10}$ to $1\text{-}2 \times 10^{11}$ positive charges per cm$^2$, localized within about 35 Å of the $Si/SiO_2$ interface.

According to one embodiment of the invention, the stoichiometry of the oxide layer is adjusted during film growth using a deposition process, such as atomic layer deposition (ALD). Here, the interface charge can be adjusted by controlling the passivation layer. Further, according to one embodiment of the invention, an n-type silicon radiation detector semiconductor device having positive fixed charge density, includes a $SiO_2$ passivation material on the sidewalls. In another embodiment of the invention, a p-type p-type radiation detector semiconductor device having a negative fixed charge density, includes $Al_2O_3$ passivation material on the sidewalls.

According to one embodiment, the invention includes use of laser cutting, where optimization of the position and laser power for laser-dicing of semiconductor devices within a gas atmosphere for better sidewall passivation is provided. For example, if oxide growth is facilitated, the effect of the silicon oxide charge is used to improve the cut properties.

In another embodiment, the invention includes laser-cutting in combination with cleaving. For example, the device is first partially cut by the laser and then mechanically cleaved. The cleavage plane has less damage then a pure laser cut.

Figure 2:
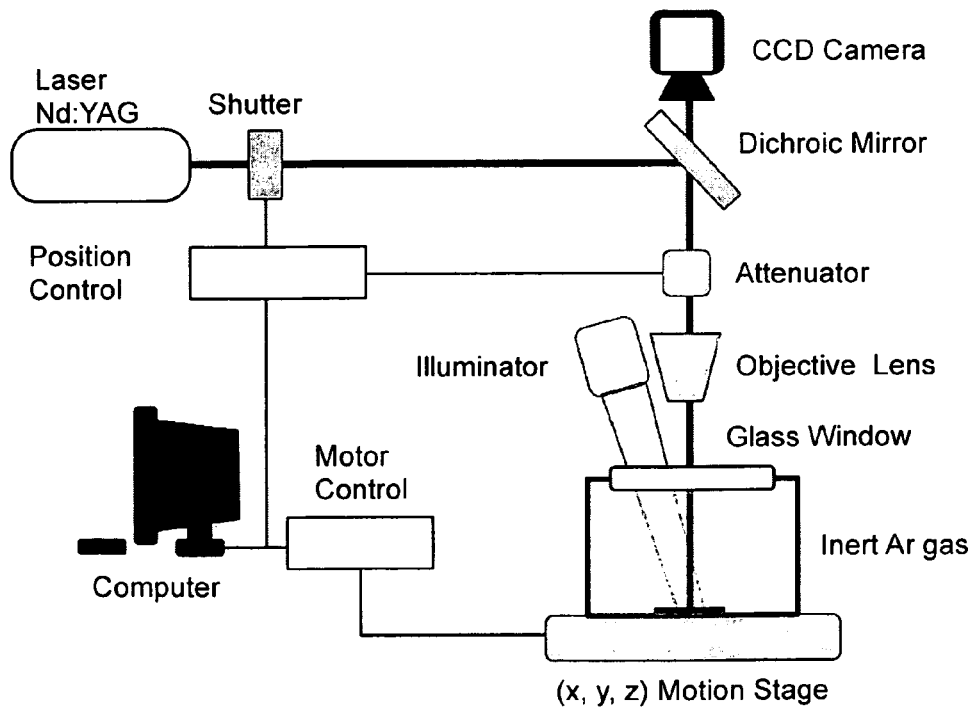
FIG. 2 shows a schematic drawing of a laser system, according to one embodiment of the invention.

In one example of the invention, an Oxford Laser E-Series micro-machining system is used with a diode-pumped solid state, frequency-tripled Nd:YAG laser (355 nm wavelength). FIG. 2 schematically shows one embodiment of a laser system, according to one embodiment of the invention. In one example the laser pulse power and frequency were set at 10 mJ and 10 kHz, respectively. The whole system was placed in a class-100 clean room. The gas enclosure can host a variety of gases. The laser power was adjusted by the attenuator setting, plus frequency, and pumping power. Furthermore, focusing and the stage motion were varied to change the effective energy on the sample.

Figure 3:
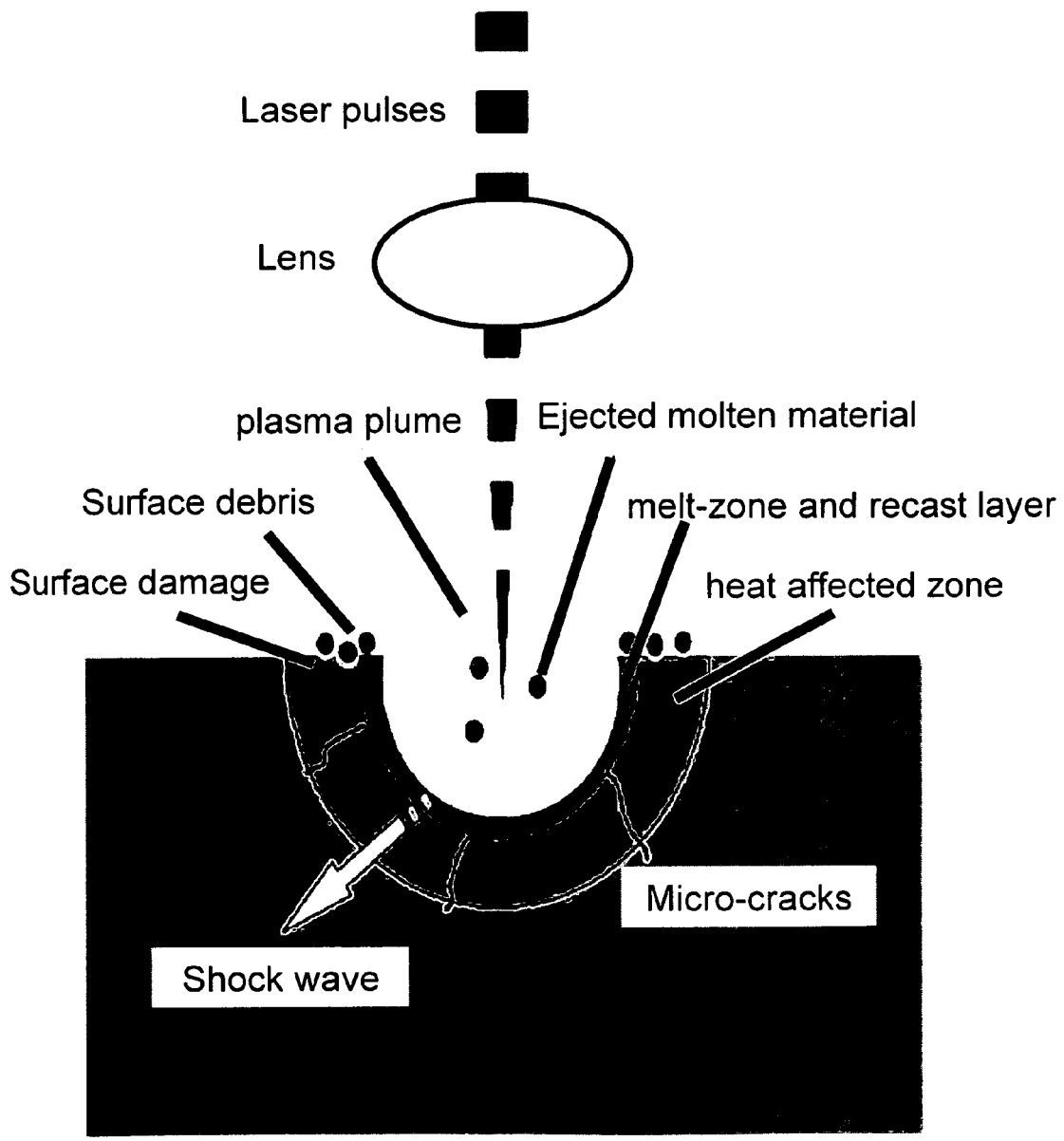
FIG. 3 shows laser cutting of silicon that is heated locally over the melting point with the molten material recast and forming a new surface layer, according to one embodiment of the invention.

During laser cutting the silicon is heated locally over the melting point. The molten material is recast and forms a new surface layer, as shown in FIG. 3. While the material is recasting the silicon can react with the surrounding gas atoms and form new compounds. Furthermore, the heated silicon can react with the surrounding gas, where the reaction can form a fixed charge density.

Figure 4A:
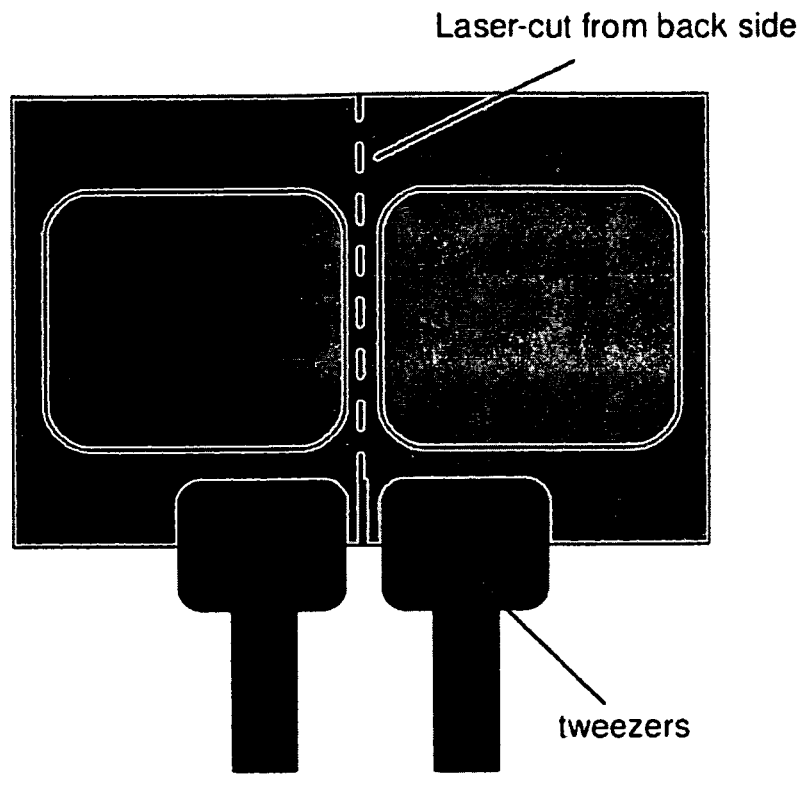
FIGS. 4a-4b show schematic drawings of the cleaving technique with a pair of tweezers and a mechanical setup that applies a shear force, respectively, according to embodiments of the current invention.
Figure 4B:
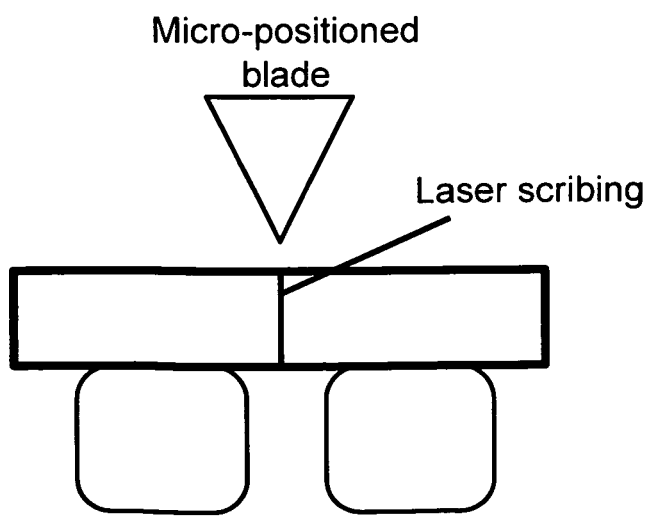

Some example settings for the laser cutting are described below. According to some embodiments, the laser can cut through the sample or make a partial cut. In the case of a partial cut, the remaining silicon is cleaved. In a further embodiment, the cleavage is made along a <100>-direction, where the cleave plane is the (110). Cleaving can include bending the semiconductor device or applying a force across the scribe, where the scribe can be disposed between a pair of fulcrums, an automatic roll breaker, a tap expender, or a wafer singulation system, for example. FIGS. 4a-4b show schematically the cleaving technique with a pair of tweezers (bending the semiconductor device) and a mechanical setup that applies a shear force (disposed between a pair of fulcrums), respectively.

Figure 5:
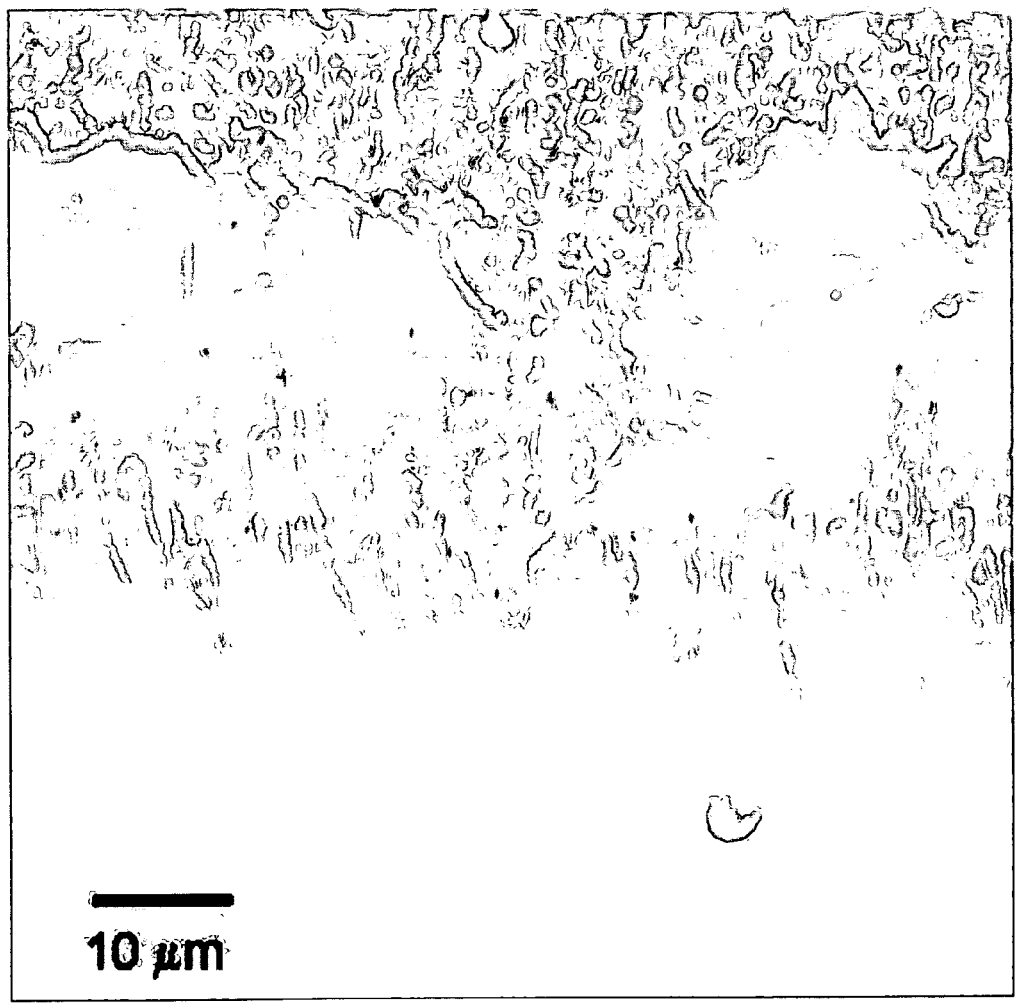
FIG. 5 shows an energy-dispersive X-ray spectroscopy map of the O element in the laser-cut, according to one embodiment of the invention.

In order to achieve a similar effect to an active edge, the silicon is cut with a laser. Depending on the gas environment of the laser cut, the silicon can partially oxidize or form other Si compounds. Depending on the gas environment the laser cut region contain e.g. silicon oxides ($SiO_x$), silicon nitrides ($SiN_x$), or silicon oxynitrides ($SiO_xN_y$). Any partial charge of the formed oxide or compound forms an "effective active edge". FIG. 5 shows an energy-dispersive X-ray spectroscopy map of the O element in the laser-cut. The shown sample was cut in air. The higher amount of O in the laser-cut region is clearly visible.

Figure 6A:
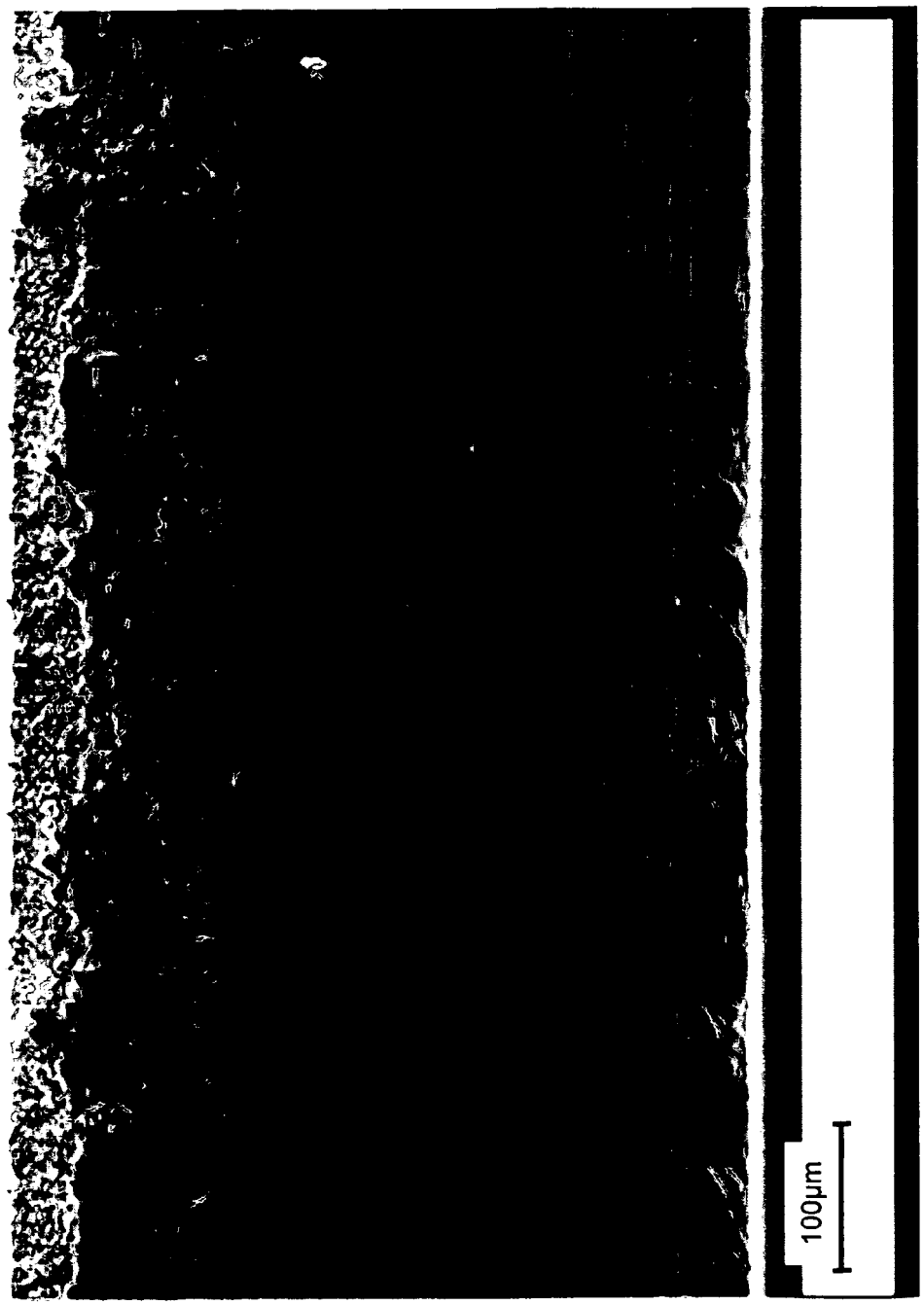
FIGS. 6a-6b show SEM micrographs of the laser-cut and then cleaved silicon, according to one embodiment of the invention.
Figure 6B:

FIGS. 6a-6b show SEM micrographs of the laser-cut and then cleaved silicon. The recast silicon is clearly visible, where shown in FIG. 6b, the recast silicon looks like "melted rock". The damage of the cleaved area depends on the crystal orientation. Silicon tends to break in the <100>-direction; the cleave plane is the (110) lattice plane. If the laser cut is parallel to <100> direction, one can more readily break the sample and reduce the wall damage, where less damaged silicon will result in better electrical properties of the sidewall.

Figure 7A:
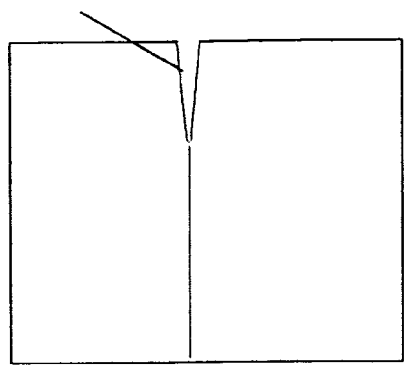
FIGS. 7a-7b show schematic drawings of the laser-cut grooves in a semiconductor according to embodiments of the invention.
Figure 7B:
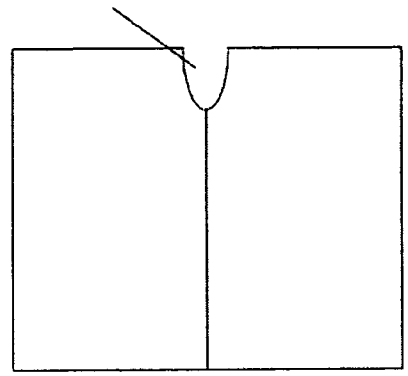

One way to reduce the laser damage is to deliberately defocus the laser while cutting. FIGS. 7a-7b show schematic drawings of the laser-cut grooves in a semiconductor. When the laser is focused (FIG. 7a) on the silicon surface, the grooves tend to have a sharp endpoint. Defocusing of the laser (FIG. 7b) generates shallower grooves with more rounded features. In both cases, the grooves define the positions of the cleavage planes. A rounded groove could also be produced by a lens system with a larger focus point, for example.

Figure 8:
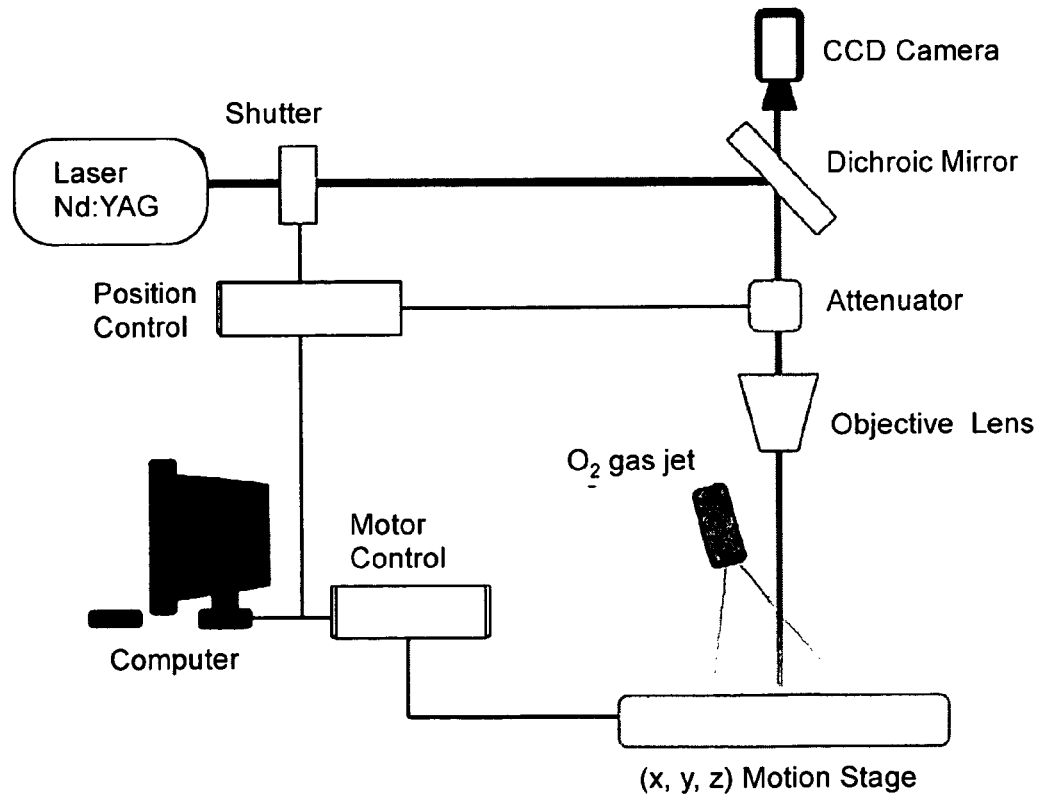
FIG. 8 shows an oxygen-purging nozzle was also used laser system of FIG. 2, according to one embodiment of the invention.

As mentioned above in FIG. 2, the gas environment for the laser cutting can be varied by using a gas enclosure. In one embodiment, an oxygen-purging nozzle is used, see FIG. 8, where oxygen (or any other gas) is directed at the cut region.

Figure 9:
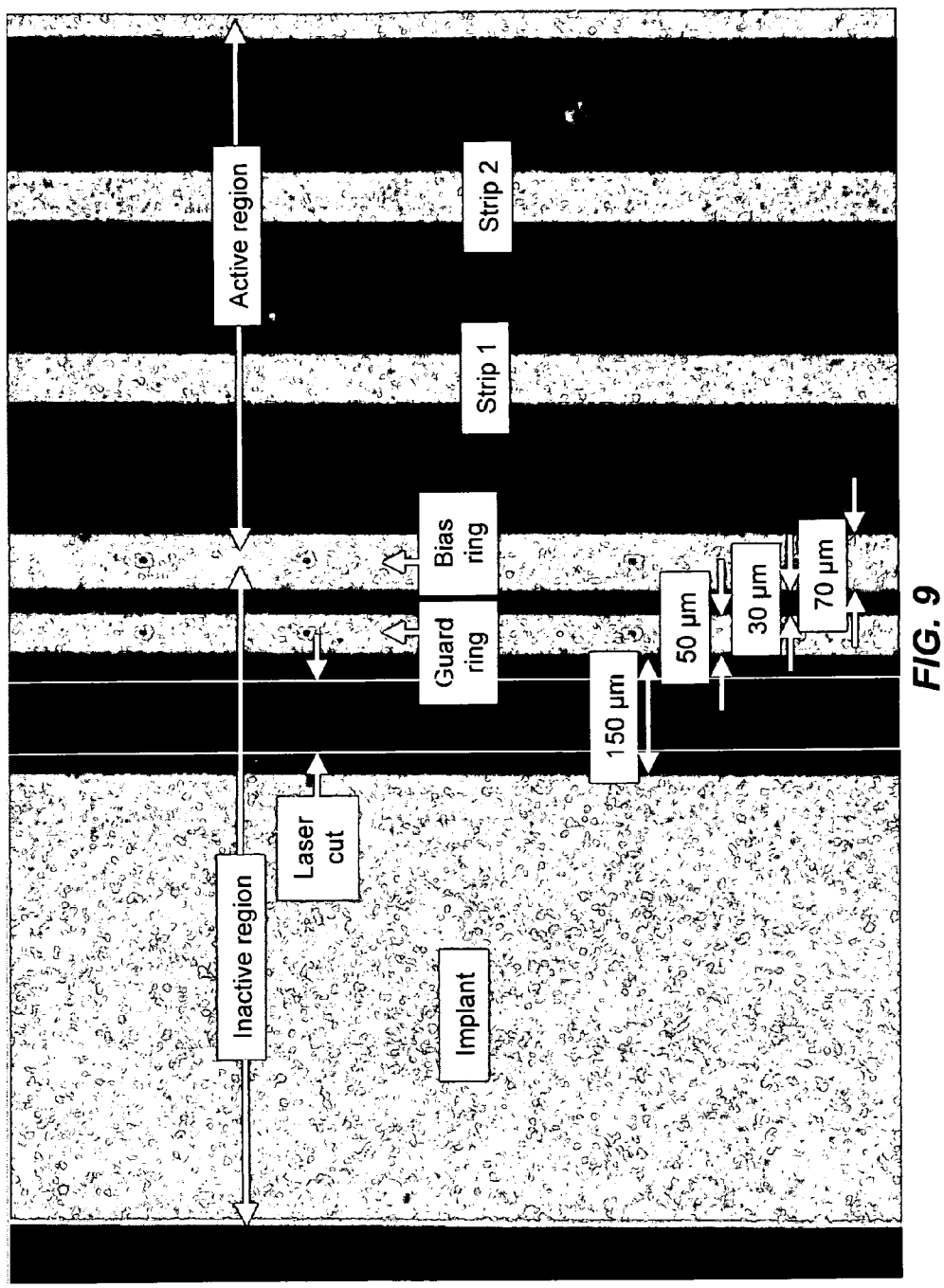
FIG. 9 shows the guard ring and laser cut positions, according to one embodiment of the invention.

Hamamatsu n-type sensors were used to test the different laser settings and cutting techniques. These were fully processed test devices for the NASA Fermi space telescope. The devices were initially cut by a diamond blade and had a guard ring structure. After further laser cutting/cleaving the leakage currents were measured and compared. FIG. 9 shows the guard ring and laser cut positions.

Figure 10:
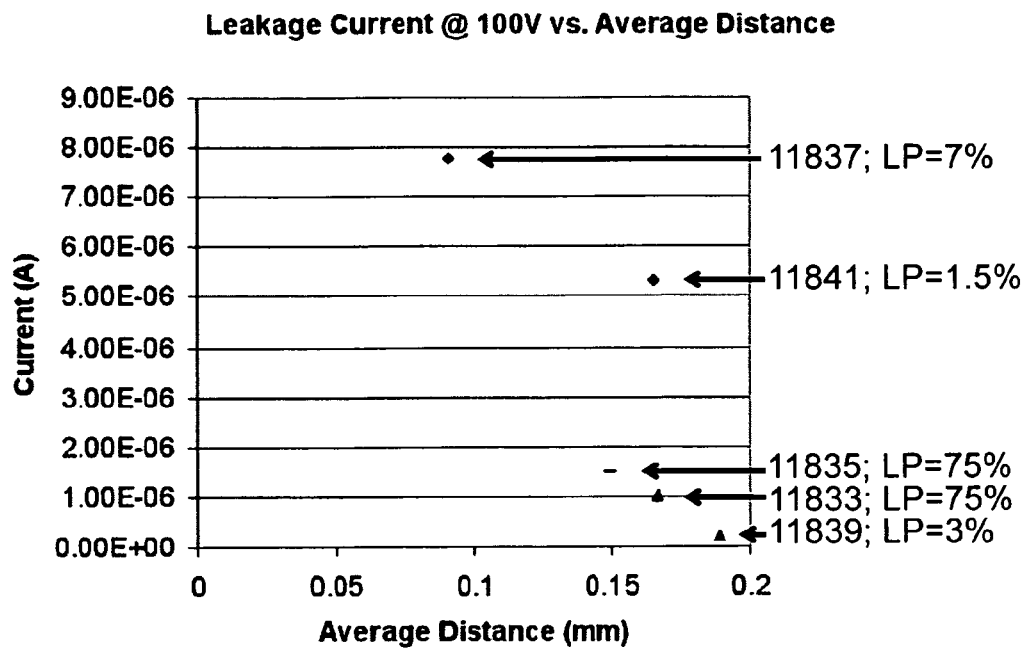
FIG. 10 shows the leakage current values for different cuts, according to one embodiment of the invention.

FIG. 10 shows the leakage current values for different cuts. The influence of cut position and laser power is shown. The laser-cuts were made at the front side and the sample cleaved with the tweezers.

Figure 11:
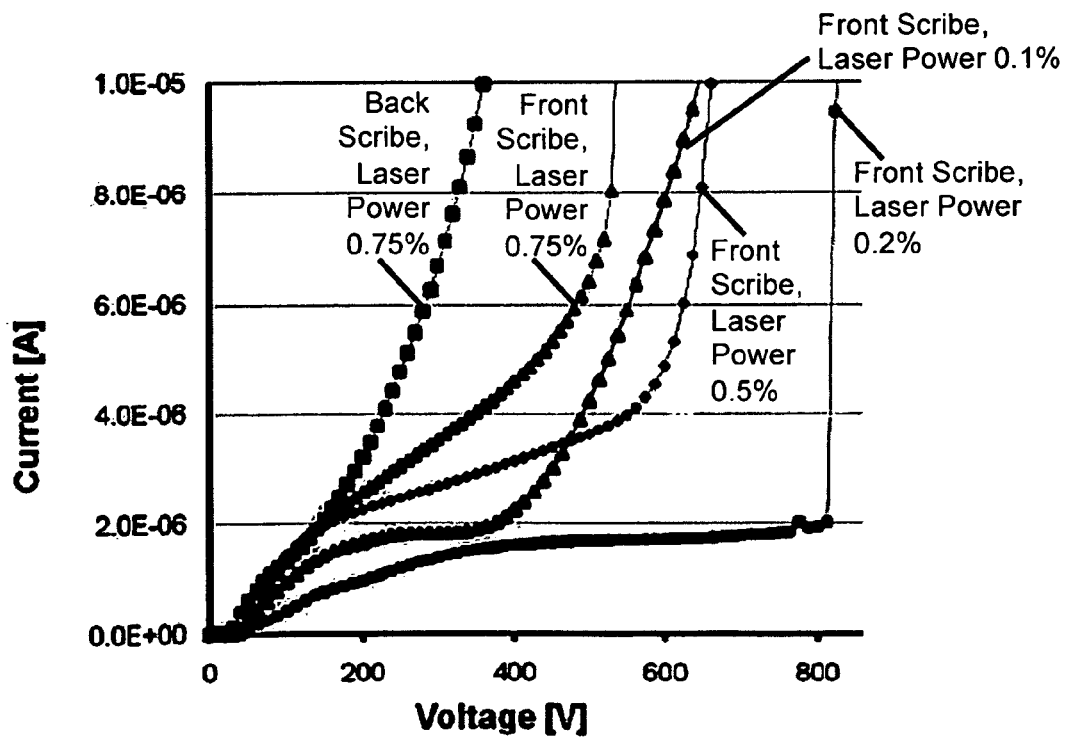
FIG. 11 shows IV curves of n-type sensors scribed at different sides with different amount of laser power, according to embodiments of the invention.

The sensor performance was evaluated after scribing on either the front side or the backside while varying the laser power. Other conditions being equal, scribing on the front side leads to better performance, see FIG. 11. An unexpected result is that the device cut from the front side performs better. One would normally assume that the damage region should be placed as far as possible from the active area. Furthermore, the depletion region extents further into the guard ring region on the front side. A possible explanation is the formation of an "active edge like" effect from the laser-cut region due to the formed silicon oxide.

Figure 12:
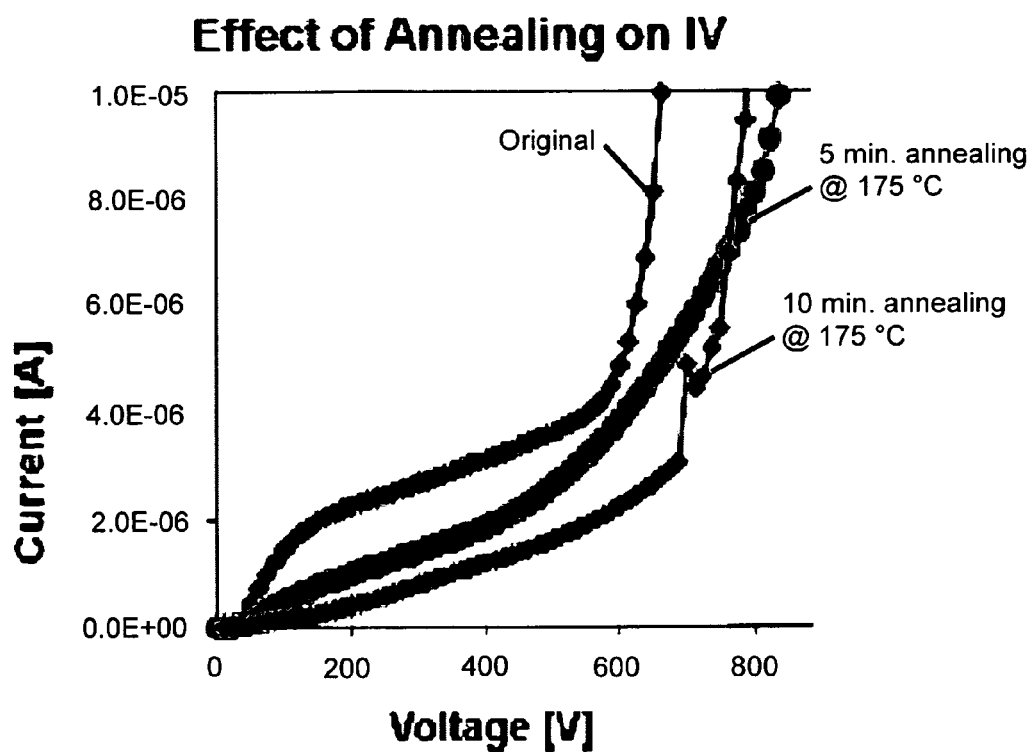
FIG. 12 shows Effect of high-temperature annealing on the leakage current of cleaved n-type sensors, according to embodiments of the invention.

According to another embodiment of the invention, UV light exposures after cleaving improve the performance in some cases. According to another embodiment, annealing of a cleaved sensor at 175° C. for 5 minutes reduces leakage current for n-type sensors, as shown in FIG. 12. Both UV treatment and annealing facilitate formation of a thin oxide layer.

Some important aspects of the invention include providing a closer tiling of radiation detectors, which is of great importance for multiple applications, ranging form Homeland Security, to medical imaging, to high energy physics experiment instrumentation. Further, the current invention offers an option to produce an "active edge" in a faster single wafer process. In one embodiment, the cutting and oxidation is done in one single step. The laser-cutting and cleaving method of the current invention can be applied to IC (integrated circuit) production, power electronics IC production, radiation detector (or sensor) production, and solar cell production.

According to another embodiment of the invention, minimizing the inactive area includes using a silicon oxide layer at the active area edge. Since there is a fixed positive charge at the silicon/silicon oxide interface, this charge can help to push away carriers for the edge or to form an inversion layer. Since the effect is induced by an interface (not by ions implanted into the silicon), these edges are called "passive edges" or "slim edges". As for the PN junction, an oxidation requires a high temperature process step and cannot be done on a die after metallization. One embodiment of the invention provides a slim edge using an alumina passivation layer. According to different embodiments of the invention, the alumina layer can be applied during device fabrication or on the metalized die. The alumina layer, due to a negative charge at the silicon/alumina interface, provides a passive edge-like passivation for p-type based sensors. Tiled radiation detector arrays find a wide range of uses in Military, Home-Land-Security, and civilian applications. Examples for civil applications are medical imaging or trackers in high-energy physics experiments. The current invention could also be used for photo detector fabrication or densely packed high voltage electronics.

According to one example of fabrication of the invention, the enhanced active area of a radiation detector is formed by, first laser cutting or cleaving a wafer or a finished die to provide at least one device with a reduced inactive area. The device's sidewall are then with a layer of dielectric material, for example $Al_2O_3$ using thermal ALD at a temperature of 300° C. An optional step includes removing any excess dielectric material from the devices, for example etching $Al_2O_3$ from the top surface with a hard mask along the coated-device sidewalls. A further optional step includes annealing the etched die to improve the properties of the resistive material on the die sidewalls, for example annealing $Al_2O_3$ at a temperature of ≤400° C.

According to one embodiment, a bilayer is used that includes a thin dielectric with a metal layer. By applying a voltage on the metal, a negative or positive electric field can be induced at the sidewall, and therefore affect its electrical properties. The advantage of an external applied field is that the voltage can be easily adjusted. Dielectric and metal layers can be deposited by ALD.

Figure 13:
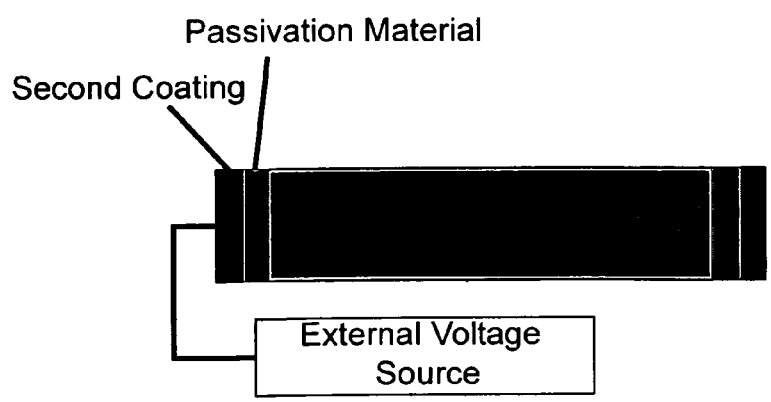
FIG. 13 shows the passivation material coated with an electrically conductive second coating connected to an external voltage source, according to one embodiment of the invention.

FIG. 13 shows one embodiment of the invention that includes coating the passivation material with a second coating, where the second coating is electrically conductive, and the second coating is connected to an external voltage source. The applied voltage generates an electric filed within the semiconductor, analogous to the fixed charge.

Since the passivation material has a fixed charge, it modifies the distribution of the carrier and electric field at the edge of the device. Further, most dielectrics, like silicon oxide and silicon nitride, have a fixed positive charge at the silicon/dielectric interface. According to one embodiment, for low-doped n-type Si this charge is used as an edge passivation. For p-type silicon, a negative interface charge is needed to achieve the same effect. Properly treated $Al_2O_3$ (alumina) layers can form negative charges at the silicon interface with densities of ~$10^{12}$-$10^{13}$ cm$^{-2}$. $Al_2O_3$ is used in the solar cell industry as a surface passivation layer, increasing the minority carrier lifetime. When an alumina layer is deposited on p-type Si, the interface charge forms an accumulation layer and a reduction of the effective surface recombination. On high resistivity wafers this effect is very pronounced.

In one example of the invention, a finished p-type sensor die was cut with a laser. The laser-cutting system used was an Oxford Laser Instrument E-Series mirco-machining system. The laser power was ~9 W/cm$^2$. The laser can cut through the sample or make a partial cut. With a partial cut, the remaining silicon is cleaved, where the cleavage plane here tended to run along the <100> silicon crystal direction. Cleaving can be done manually or by applying an external force. Since the silicon is heated during laser-cutting the laser processing was done in a vacuum enclosure to minimize oxidation. An inert gas atmosphere like an Ar gas environment would also prevent the silicon from oxidizing.

In one embodiment, the laser machining system can also be used to notch the silicon. Here, a notch is an indentation in an edge of the silicon. The notch can be through-cut or partial cut. By applying a force one can cleave the silicon from the notch. The cleavage will follow the crystal plane, such as the <100> silicon direction. The cleaved silicon has almost no defects (no micro-cracks etc). After cleaving the sample should be placed immediately into a vacuum atmosphere to minimize the formation of a native oxide.

In another embodiment, an ALD (atomic layer deposition) process is used for the $Al_2O_3$ deposition. ALD growth provides atomic layer control and conformal coatings on high aspect ratio structures. Since ALD deposition is conformal on high aspect ratio structures and a low-temperature process, this is a superior choice for sensor edge passivation. ALD is based on sequential, self-limiting surface chemical reactions. The binary reaction for $Al_2O_3$ is:

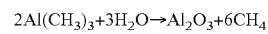
$$2Al(CH_3)_3 + 3H_2O \rightarrow Al_2O_3 + 6CH_4$$

It can be split into the following surface half-reactions:

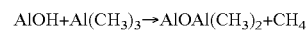
$$AlOH + Al(CH_3)_3 \rightarrow AlOAl(CH_3)_2 + CH_4$$

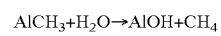
$$AlCH_3 + H_2O \rightarrow AlOH + CH_4$$

The half reactions are repeated until an $Al_2O_3$ layer of the desired thickness is reached. Since all reactions can run at ≤300° C., making this a low-temperature process, harmless to the existing sensor structures, and adding a very small thermal budget. In one embodiment thermal ALD and plasma-assisted ALD can be used, where during plasma-assisted ALD, a plasma source generates the reactive species for the surface reactions. The deposition temperature varied from 150 to 300° C. Thermally deposited alumina layers lead to lower leakage currents. In this example 800 deposition cycles at 300° C. were used with a deposition rate of 1.3 A/cycle. The sample was "face-down" on a silicon carrier wafer.

Figure 14:
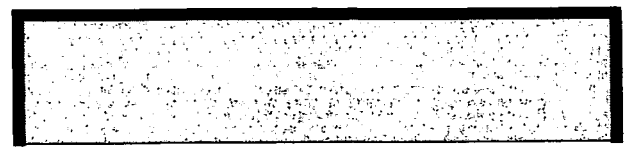
FIGS. 14-15 show schematic drawings of the general process sequences, according to embodiments of the invention.
Figure 14:
Figure 14:

After ALD deposition, the alumina layer was etched in a RIE etch step as shown in FIG. 14. The cleaved sidewall was protected by a Kapton (a polyimide film developed by DuPont) hard mask. The alumina was etched in a $CF_4$ plasma (15 mTorr, 25 sccm CF4, 75 W forward bias). The leakage current can be reduced by an annealing step. In this example the alumina layer was annealed for 10 min in an oven under nitrogen flow (pressure 1,500 mTorr).

Figure 15:
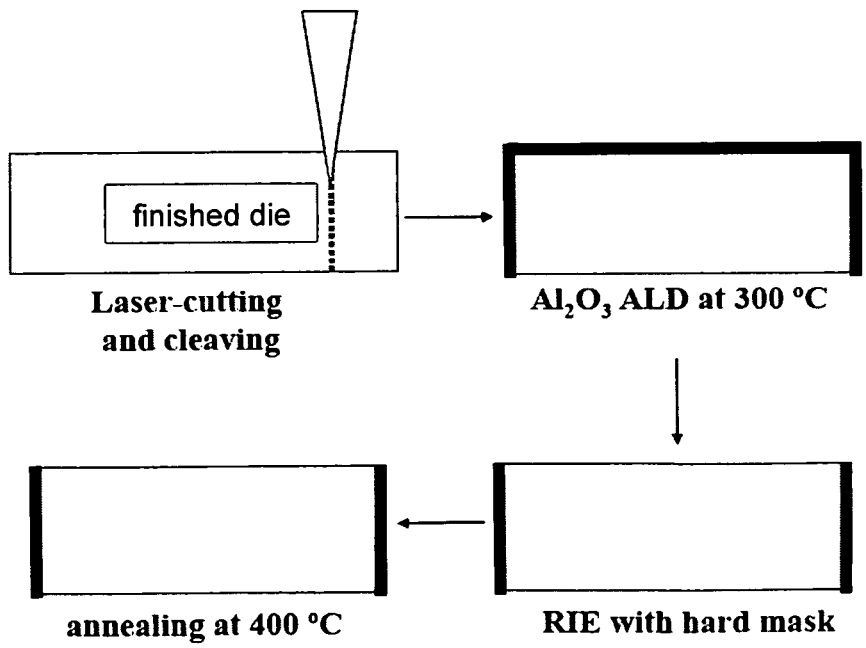

After RIE etching the sample can be annealed. The annealing step changes charge at the silicon $Al_2O_3$ interface and repairs damage due to RIE etching. FIGS. 14-15 show schematic drawings of the general process sequences, according to embodiments of the invention.

Since the cleaving method of the current invention leads to a sidewall with no (or very little) damage, in the ideal case no guard ring is needed.

The current invention can be used on a wafer or die scale. The alumina layer can be applied on a DRIE etch trench or on the side of the die after cleaving/laser-cutting. The invention could also be used for IC (integrated circuit) production, power electronics IC production, radiation detector (or sensor) production, and solar cell production.

According to one embodiment, an etching process is used to induce a scribe line on the semiconductor surface, followed by cleaving and coating with a passivation material. There are two advantages to the current embodiment, where the etching-based scribe is very shallow, for example up to 50 micrometers, relative to the depth of scribe lines in other embodiments. This enables a larger area of the sidewall to have a surface with low defect density (and better performance). This embodiment of the process is applicable to thin sensors, say 50 micron thick, which are useful in some applications. Another advantage of the current embodiment is that there is inherently less damage in the bulk of the sensor from the scribing process, leading to a better and more consistent performance. Further, the current embodiment allowed for cleaving longer sensors, which is helpful with large-area sensors.

According to another embodiment, n-type sensors are coated using plasma-enhanced chemical vapor deposition (PECVD) with two types of sidewall coating: silicon oxide and silicon nitride, where the deposition is targeted at the sensor sidewall for the nitride deposition. This results in generally better performance than room temperature annealing or high-temperature annealing, where the PECVD process leads to a much better quality of the oxide, versus the silicon oxide formation on the sidewall by annealing. The invention further uses other deposition processes that include chemical vapor deposition, vapor deposition, corona discharge, or flame-based aerosol coating.

In another embodiment, the appropriate sign for the interface charge between the sidewall coating and the bulk of the silicon is needed. Thus, alumina is applied for p-type sensors and silicon oxide or silicon nitride for n-type sensors.

Figure 16:
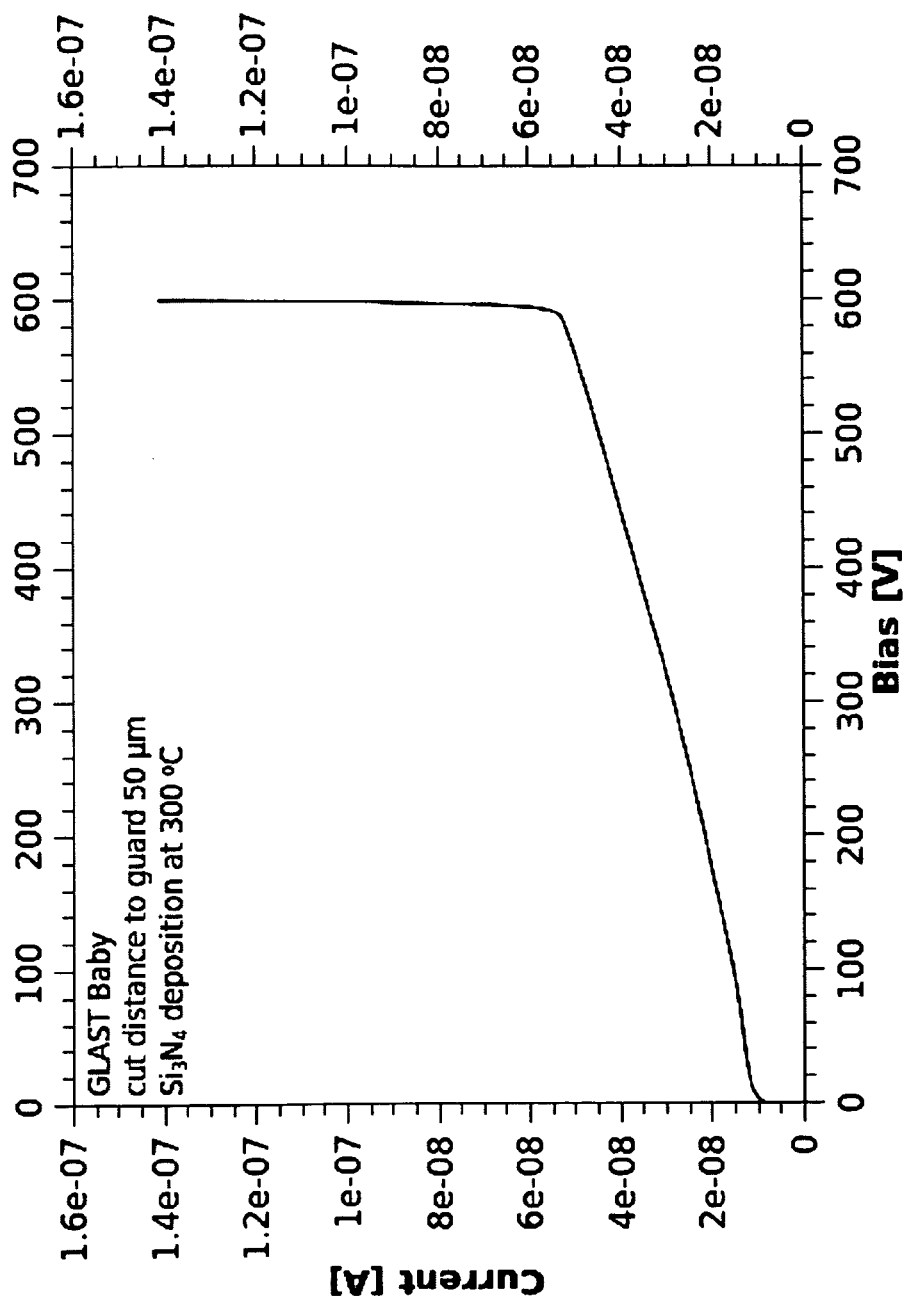
FIG. 16 shows a graph of the performance of an N-type device with slim edges, according to one embodiment of the invention.

FIG. 16 shows a graph of the performance of an N-type device with slim edges, according to one embodiment of the invention. The breakdown voltage for this device is about 600 V, many times higher than its full depletion voltage. Such performance is characteristic of traditional sensors with up to 1 mm wide inactive area at the periphery of the device. Here it is achieved with only 50 micron distance between the guard ring and the edge.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, the invention could also be used for e.g. Germanium, III-V, or II-VI compound semiconductors. Other gases or gas mixtures could be used for oxidizing. The amount of oxidizing gases could be adjusted by a gas mixture made from e.g. oxygen and nitrogen. Furthermore, the silicon oxidation would be promoted by ozone or any other oxidizing gas environment. Another example for an oxidizing gas is $N_2O$ (nitrous oxide). Orientation of the cleaving could be done by other methods that determine the silicon direction. One example is to use X-ray Crystallography to determine the exact orientation. This could be done before the laser-cut and/or before the fabrication of the devices, which will be cut. Post-cleaving annealing can be done in different gas environments or temperatures, or UV light could be used for the post-cleaving annealing. Ozone or nitrous are two examples for gas environments for post-cleaving processing.

The annealing can also be done in an oven or a RTA (rapid thermal annealer). Mechanical cleaving can be done by any mechanical setup that applies a shear force. The applied force is also a parameter that can be varied to optimize the sensor performance. Since ALD is a layer-by-layer deposition technique, stoichiometry of the dielectric can be adjusted during film growth. The interface charge changes with the stoichiometry. "Stealth dicing" may be used, that includes a dicing method that forms a stressed layer in the substrate by focusing a laser inside the substrate, and then a small amount of mechanical force (for example, from a stretched tape expander) is used to separate the pieces. As described above, the effect of an alumina layer provides a negative interface charge. Other dielectrics with a negative interface charge would have a similar effect. One could also use a bilayer having a thin dielectric with a metal layer. By applying a voltage on the metal, one could induce a positive or negative electric potential on the sidewall. The advantage of an external applied field is that the voltage can be adjusted. Dielectric and metal layers can be deposited by ALD.

All such variations are considered to be within the scope and spirit of the present invention as defined by the following claims and their legal equivalents.

What is claimed:

1. A method of singulating semiconductor devices in the close proximity to active structures by controlling interface charge of semiconductor device sidewalls, comprising:
   a. forming a scribe on a surface of a single crystal semiconductor device, wherein said scribe is within 5 degrees of a crystal lattice direction of said single crystal semiconductor device;
   b. cleaving said single crystal semiconductor device along said scribe, wherein said single crystal semiconductor devices are separated;
   c. using a coating process to coat the entire sidewalls of said cleaved single crystal semiconductor device with a passivation material,
   d. using a thickness of said passivation material to form a fixed charge density at an interface of said cleaved single crystal semiconductor sidewalls; and
   e. using said fixed charge density at an interface of said single crystal semiconductor device sidewalls to interact with charge carriers in the bulk of said single crystal semiconductor device, wherein said interaction comprises controlling the distribution of said charge carriers in the bulk of said single crystal semiconductor device, using said thickness of said passivation material, and controlling an electric field at an edge of said single crystal semiconductor device, using said thickness of said passivation material, wherein said single crystal semiconductor device is singulated proximal to an active area of said single crystal semiconductor device.

2. The method according to claim 1 further comprising coating said passivation material with a second coating, wherein said second coating is electrically conductive, wherein said second coating is connected to an external voltage source.

3. The method according to claim 1, wherein said scribe is formed by a process selected from the group consisting of etching, laser-machining, deposition of light energy within a semiconductor device volume, and applying a mechanical force using a mechanical scribing apparatus.

4. The method according to claim 3, wherein the etching is done with $XeF_2$.

5. The method according to claim 3, wherein said laser comprises a specific wavelength in a spectral region selected from the group consisting of ultraviolet, deep ultraviolet, visible light, infrared, and far infra-red.

6. The method according to claim 1, wherein said scribe comprises:
   a. photo masking said semiconductor device to define a scribe line; and
   b. etching a top surface of said semiconductor device using a reactive ion etching process.

7. The method according to claim 1, wherein said cleaving is formed by a process selected from the group consisting of bending said semiconductor device, applying a force across said scribe, wherein said scribe is disposed between a pair of fulcrums, an automatic roll breaker, a tap expender, and a wafer singulation system.

8. The method according to claim 1, wherein said coating said sidewalls of said cleaved semiconductor device is by a process selected from the group consisting of atomic layer deposition, chemical vapor deposition, plasma-enhanced chemical vapor deposition, vapor deposition, corona discharge, and flame-based aerosol coating.

9. The method according to claim 1, wherein said semiconductor device is made from silicon having a substrate resistivity over 1,000 Ohm-cm.

10. The method according to claim 9, wherein said semiconductor device is an n-type silicon radiation detector comprising a positive fixed charge density on the sidewall.

11. The method according to claim 10, wherein said passivation material on said sidewalls comprises $SiO_2$ or $Si_3N_4$.

12. The method according to claim 9, wherein said semiconductor device is a p-type radiation detector comprising a negative fixed charge density on the sidewall.

13. The method according to claim 12, wherein wherein said passivation material on said sidewalls comprises $Al_2O_3$.

14. The method according to claim 1, wherein said coating is selected from the group consisting of $Al_2O_3$, $SiO_2$, $Si_3N_4$, (a-$Si_xN_y$:H), amorphous silicon, CdTe, and $TiO_2$.

15. The method according to claim 1, wherein a depth of said scribe is up to 50 micrometer.

16. The method according to claim 1, wherein fabricating a minimal peripheral structure for the semiconductor device comprises disposing said scribe proximal to an active area or a guard ring of said device.

17. The method according to claim 1, wherein said semiconductor device is selected from the group consisting of a solar cell, an imaging device, and a high voltage integrated circuit device.

18. The method according to claim 1, wherein said scribing is done in a gas atmosphere.

19. The method according to claim 18, wherein said gas in said atmosphere reacts with said semiconductor during said scribing, wherein said reaction forms a fixed charge density.

* * * * *